(12) United States Patent
Baik

(10) Patent No.: US 7,042,107 B2
(45) Date of Patent: May 9, 2006

(54) SCALABLE TWO TRANSISTOR MEMORY DEVICES

(75) Inventor: Seung-Jae Baik, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 25 days.

(21) Appl. No.: 10/800,792

(22) Filed: Mar. 15, 2004

(65) Prior Publication Data
US 2004/0238974 A1    Dec. 2, 2004

(30) Foreign Application Priority Data
May 29, 2003    (KR) ............... 10-2003-0034500

(51) Int. Cl.
*H01L 27/88*    (2006.01)
(52) U.S. Cl. ............... 257/900; 257/331; 257/903; 257/904; 438/240; 438/258; 365/63
(58) Field of Classification Search ............... 257/331, 257/903, 904; 438/240, 258; 365/63
See application file for complete search history.

(56) References Cited

U.S. PATENT DOCUMENTS

| | | | |
|---|---|---|---|
| 5,952,692 A | | 9/1999 | Nakazato et al. |
| 6,475,857 B1 * | | 11/2002 | Kim et al. ............ 438/240 |
| 6,528,896 B1 * | | 3/2003 | Song et al. ............ 257/327 |
| 6,635,921 B1 | | 10/2003 | Yi et al. |

FOREIGN PATENT DOCUMENTS

| KR | 2002-96809 A | 12/2002 |
|---|---|---|
| KR | 2003-29203 A | 4/2003 |

OTHER PUBLICATIONS

Ledford, Stephen, "Non-Volatile Memory Technology Overview," Motorola Semiconductor Application Note, Doc. No. AN1837/D, Motorola, Inc., 2000, pp. 1-17.

* cited by examiner

*Primary Examiner*—Mai-Huong Tran
(74) *Attorney, Agent, or Firm*—Myers Bigel Sibley & Sajovec PA

(57) ABSTRACT

A memory device includes a semiconductor substrate, a first gate insulator on a first portion of a semiconductor substrate, a storage node on the first gate insulator, a tunnel junction barrier on the storage node and a data electrode on the layer tunnel junction barrier. The device further includes a second gate insulator layer on a sidewall of the tunnel junction barrier, a third gate insulator on a second portion of the substrate adjacent the tunnel junction barrier and a gate electrode on the second gate insulator and the third gate insulator. First and second impurity-doped regions are disposed in the substrate and are coupled by a channel through the first and second portions of the substrate. Fabrication of such a device is also describes.

20 Claims, 15 Drawing Sheets

SCALABLE TWO TRANSISTOR MEMORY DEVICES

CROSS REFERENCE TO RELATED APPLICATIONS

This application claims priority under 35 U.S.C. § 119 to Korean Patent Application 2003-34500 filed on May 29, 2003, the contents of which are herein incorporated by reference in their entirety.

BACKGROUND OF THE INVENTION

The present invention relates to semiconductor devices and methods of forming the same, and more particularly, to scalable two transistor memory devices and methods of forming the same.

A dynamic random access memory (DRAM) device can be highly integrated in comparison with a static random access memory (SRAM) device. A DRAM device typically requires a periodic refresh in order to retain data stored in capacitors. Therefore, a typical DRAM consumes power even in a stand-by mode. On the other hand, non-volatile memory devices, such as flash memory devices, typically do not need to refresh memory cells in order to retain the stored data. However, a typical flash memory device takes a relatively long time to program and a tunneling oxide layer in the flash memory device may be damaged as erase and program operations are repeated.

Therefore, new memory cells having advantages of the DRAM device and the flash memory device have been studied. One such type of new memory cell is a scalable two-transistor memory (STTM) cell, as described in U.S. Pat. No. 5,952,692 to Nakazato et al. entitled "Memory Device With Improved Charge Storage Barrier Structure." An STTM cell can provide high speed, low power consumption and high integration.

FIG. 1 is a cross-sectional view showing a unit cell of a conventional STTM device. Referring to FIG. 1, the unit cell of the memory device includes a planar transistor and a vertical transistor. The planar transistor includes a drain region 17$d$, a source region 17$s$ and a storage node 5. The drain/source regions 17$d$ and 17$s$ are formed at a predetermined region of a semiconductor substrate 1, spaced apart from each other. The storage node 5 is disposed over a channel region between the drain/source regions 17$d$ and 17$s$. The source/drain regions 17$s$ and 17$d$ are impurity-doped regions formed by implanting impurity ions into the semiconductor substrate 1. The drain region 17$d$ corresponds to a bit line. The storage node 5 is electrically isolated. A gate insulation layer 3 is interposed between the storage node 5 and the channel region.

A multiple tunnel junction barrier pattern 12 and a data line 13 are formed on the storage node 5. The multiple tunnel junction barrier pattern 12 includes alternating semiconductor layers 7 and tunnel insulation layers 9. A top of the multiple tunnel junction barrier pattern 12 may be the tunnel insulation layer 9.

A data line 13 extends to electrically connect with a plurality of neighboring memory cells. The storage node 5, the multiple tunnel junction barrier pattern 12 and the data line 13 compose a multiple layer pattern 15. Sidewalls and an upper surface of the multiple layered pattern 15 are covered by a gate interlayer dielectric layer 19. A control line 21 is disposed on the gate interlayer dielectric layer 19 and crosses over the date line 13. The data line 13, the multiple tunnel junction barrier pattern 12, the storage node 5 and the control line 21 form the vertical transistor.

According to the conventional technology as described above, the source/drain regions 17$s$ and 17$d$ are impurity-doped regions. Thus, as size of the unit cell becomes decreased, punch through between the source/drain regions 17$s$ and 17$d$ may become more likely. That is, even though the unit cell may be reduced in size, properties, such as punch through between the source/drain regions 17$s$ and 17$d$, may limit scalability.

SUMMARY OF THE INVENTION

According to some embodiments of the present invention, a memory device includes a semiconductor substrate, a first gate insulator on a first portion of a semiconductor substrate, a storage node on the first gate insulator, a tunnel junction barrier on the storage node and a data electrode on the tunnel junction barrier. The device further includes a second gate insulator layer on a sidewall of the tunnel junction barrier, a third gate insulator on a second portion of the substrate adjacent the tunnel junction barrier and a gate electrode on the second gate insulator and the third gate insulator. First and second impurity-doped regions are disposed in the substrate and are coupled by a channel through the first and second portions of the substrate. The storage node may be on a first channel in the first portion of the substrate, and the gate electrode may be on a second channel region in the second portion of the substrate that couples the first channel to the first impurity-doped region. The second channel may be configured to serve as a source/drain for the first channel.

In further embodiments of the present invention, the device further includes a fourth gate insulator on a second sidewall of the tunnel junction barrier and a fifth gate insulator on a third portion of the substrate between the tunnel junction barrier and the second impurity-doped region. The gate electrode is disposed on the fourth and fifth gate insulators. The gate electrode may be on a third channel region in the third portion of the substrate that couples the first channel to the second impurity-doped region. The third channel may be configured to serve as a source/drain for the first channel.

In some embodiments, the second, third, fourth and fifth gate insulators include respective portions of a continuous insulation layer conforming to a top of the data electrode, to the sidewalls of the tunnel junction barrier and to surfaces of the substrate adjacent thereto, and the gate electrode includes a continuous conductive layer overlying the continuous insulation layer. The gate electrode may further include conductive sidewall spacers interposed between the portions of the continuous insulation on the sidewalls of the tunnel junction barrier and the continuous conductive layer.

According to further aspects of the present invention, a memory device includes a semiconductor substrate and a tunnel junction barrier transistor having a storage node on the substrate, a tunnel junction barrier on the storage node, and a gate electrode on a sidewall of the tunnel junction barrier that controls a channel of the tunnel junction barrier transistor. The device further includes a first planar transistor having a first channel in the substrate disposed transverse to the channel of the tunnel junction barrier transistor and controlled by the storage node of the tunnel junction barrier transistor and a second planar transistor having a second channel in the substrate disposed adjacent to the first planar transistor and transverse to the channel of the tunnel junction barrier transistor and having a gate electrode electrically coupled to the gate electrode of the tunnel junction barrier transistor.

In some embodiments, the gate electrodes of the tunnel junction barrier transistor and the second planar transistor comprise a continuous conductive layer having a first portion on the sidewall of the tunnel junction barrier and a second portion that extends transverse to the first portion onto the channel of the second planar transistor. The second planar transistor may comprise respective second channels on respective sides of the first channel. The gate electrodes of the tunnel junction barrier transistor and the second planar transistor may comprise a first continuous conductive layer having a first portion on a first sidewall of the tunnel junction barrier and a second portion that extends transverse to the first portion onto a first one of the second channels of the second planar transistor, and a second continuous conductive layer having a first portion on a second sidewall of the tunnel junction barrier opposite the first sidewall and a second portion that extends transverse to the first portion onto a second one of the second channels of the second planar transistor. In other embodiments, the gate electrodes of the tunnel junction barrier transistor and the second planar transistor may comprise a continuous conductive layer disposed on first and second opposing sidewalls of the tunnel junction barrier and on respective portions of the substrate adjacent the first and second sidewalls.

According to some method embodiments of the present invention, a memory device is fabricated. A multiple layer pattern is formed on a semiconductor substrate, the multiple layer pattern including a first gate insulator on a first portion of the semiconductor substrate, a storage node on the first gate insulator, a tunnel junction barrier on the storage node and a data electrode on the tunnel junction barrier. A second gate insulator is formed on a sidewall of the tunnel junction barrier and a third gate insulator is formed on a second portion of the substrate adjacent the multiple layer pattern. A gate electrode is formed on the second and third gate insulators. First and second impurity-doped regions are formed in the substrate, and are coupled by a channel through the first and second portions of the substrate.

In further embodiments, a first gate insulation layer is formed on the substrate. A first conductive layer is formed on the first gate insulation layer, and alternating semiconductor and tunnel insulation layers are formed on the first conductive layer. A second conductive layer is formed on the alternating semiconductor and tunnel insulation layers, and a first mask layer is formed on the second conductive layer. The first gate insulation layer, the first conductive layer, the alternating semiconductor and tunnel insulation layers, the second conductive layer and the mask layer are then patterned to form first and second spaced apart trenches. First and second insulation regions are formed in respective ones of the first and second trenches.

A portion of the mask layer is then removed to expose a portion of the second conductive layer between the first and second insulation regions. A third conductive layer is then formed on the exposed portion of the second conductive layer, and a second mask layer is formed on the third conductive layer. The first gate insulation layer, the first conductive layer, the alternating semiconductor and tunnel insulation layers, the second conductive layer, the third conductive layer and the second mask layer are then patterned to form the first gate insulator, the storage node, the tunnel junction barrier, the data electrode, and a mask pattern on the data electrode.

The second and third gate insulators may be formed by forming a second gate insulation layer on the multiple layer pattern and adjacent portions of the substrate. The gate electrode may be formed by forming first and second conductive sidewall spacers on portions of the second gate insulation layer on first and second sidewalls of the multiple layer pattern, forming a fourth conductive layer conforming to the first and second conductive sidewall spacers and the second gate insulation layer, and patterning the fourth conductive layer to form a gate electrode on the multiple layer pattern, the first and second conductive sidewall spacers, and respective portions of the gate insulation layer adjacent the first and second conductive sidewall spacers. The first and second impurity-doped regions may be formed by implanting ions into the substrate using the gate electrode as an implantation mask.

According to other method aspects, a first gate insulation layer is formed on the substrate. A first conductive layer is formed on the first gate insulation layer, and alternating semiconductor and tunnel insulation layers are formed on the first conductive layer. A second conductive layer is formed on the alternating semiconductor and tunnel insulation layers, and a first mask layer is formed on the second conductive layer. The first gate insulation layer, the first conductive layer, the alternating semiconductor and tunnel insulation layers, the second conductive layer and the first mask layer are then patterned to form the multiple layer pattern and a mask pattern thereon.

The second and third gate insulators may be formed by forming a second gate insulation layer on the multiple layer pattern and adjacent portions of the substrate. The gate electrode may be formed by forming first and second conductive sidewall spacers on portions of the second gate insulation layer on first and second sidewalls of the multiple layer pattern, forming a fourth conductive layer conforming to the first and second conductive sidewall spacers and the second gate insulation layer, and removing a portion of the conductive layer and the second gate insulation layer on the multiple layer pattern to expose the mask pattern and to leave portions of the conductive sidewall spacers and the fourth conductive layer remaining on the sidewalls of the tunnel junction barrier and adjacent portions of the second gate insulation layer. The first and second impurity-doped regions may formed by implanting ions into the substrate using the portions of the conductive sidewall spacers and the fourth conductive layer remaining on the sidewalls of the tunnel junction barrier and adjacent portions of the second gate insulation layer as an implantation mask. Gate electrode formation may further include recessing the remaining portions of the first and second conductive sidewall spacers and the fourth conductive layer thereon to below the mask pattern, and further fabrication of the device may include forming a dielectric layer on the mask pattern and the recessed conductive sidewall spacers and fourth conductive layer, planarizing the dielectric layer to expose the mask pattern, removing portions of the mask pattern to expose the multiple layer pattern, forming a fifth conductive layer on the substrate and in contact with the exposed multiple layer pattern, and patterning the fifth conductive layer to form a data line.

DETAILED DESCRIPTION OF EXEMPLARY EMBODIMENTS

Figure 1:
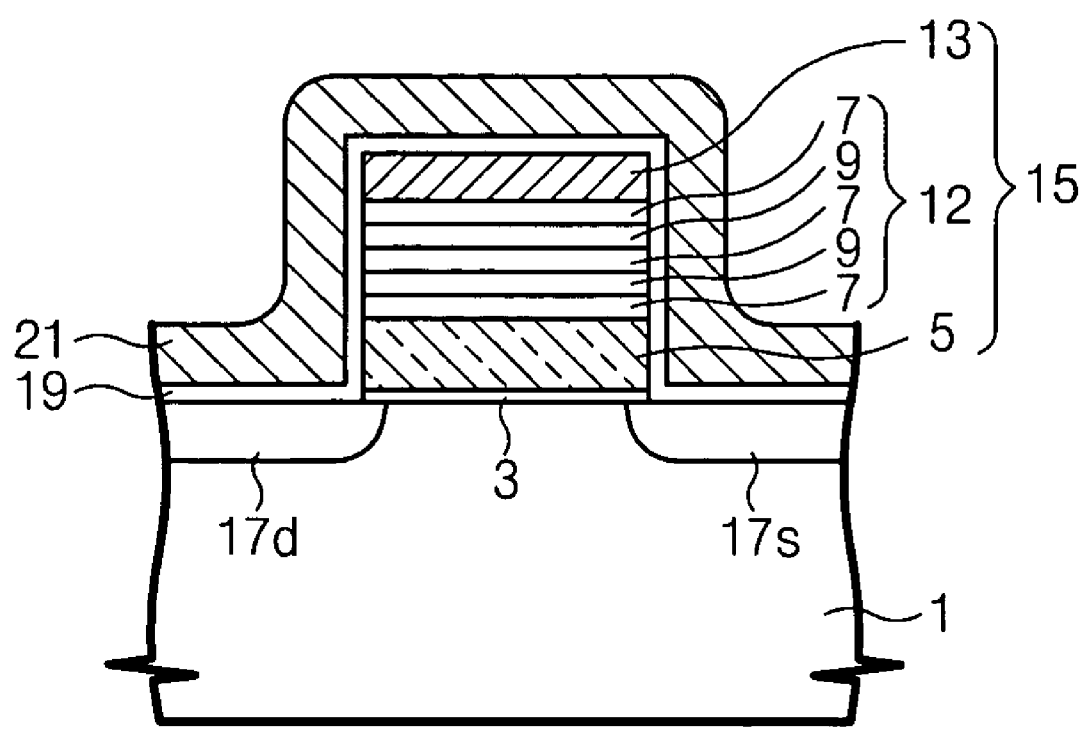
FIG. 1 is a cross-sectional view showing a unit cell of a conventional scalable two-transistor memory (STTM) device.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being "on" another element, it can be directly on the other element or intervening elements may also be present. Furthermore, relative terms, such as "beneath", may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as "below" other elements would then be oriented "above" the other elements. The exemplary term "below", can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second without departing from the teachings of the present invention. Like numbers refer to like elements throughout.

First Embodiments

Figure 2:
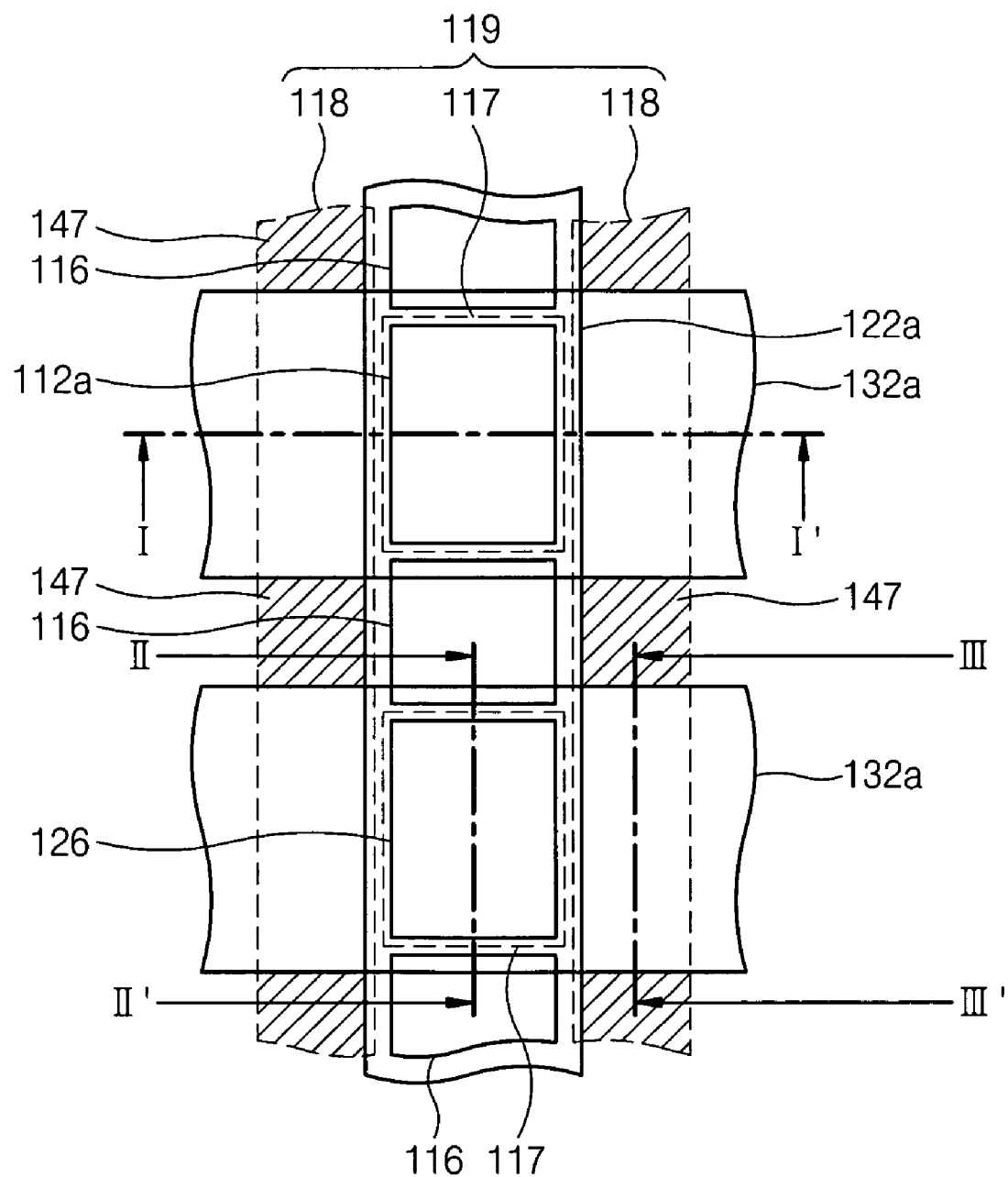
FIG. 2 is a plan view showing a memory device according to some embodiments of the present invention.
Figure 3:
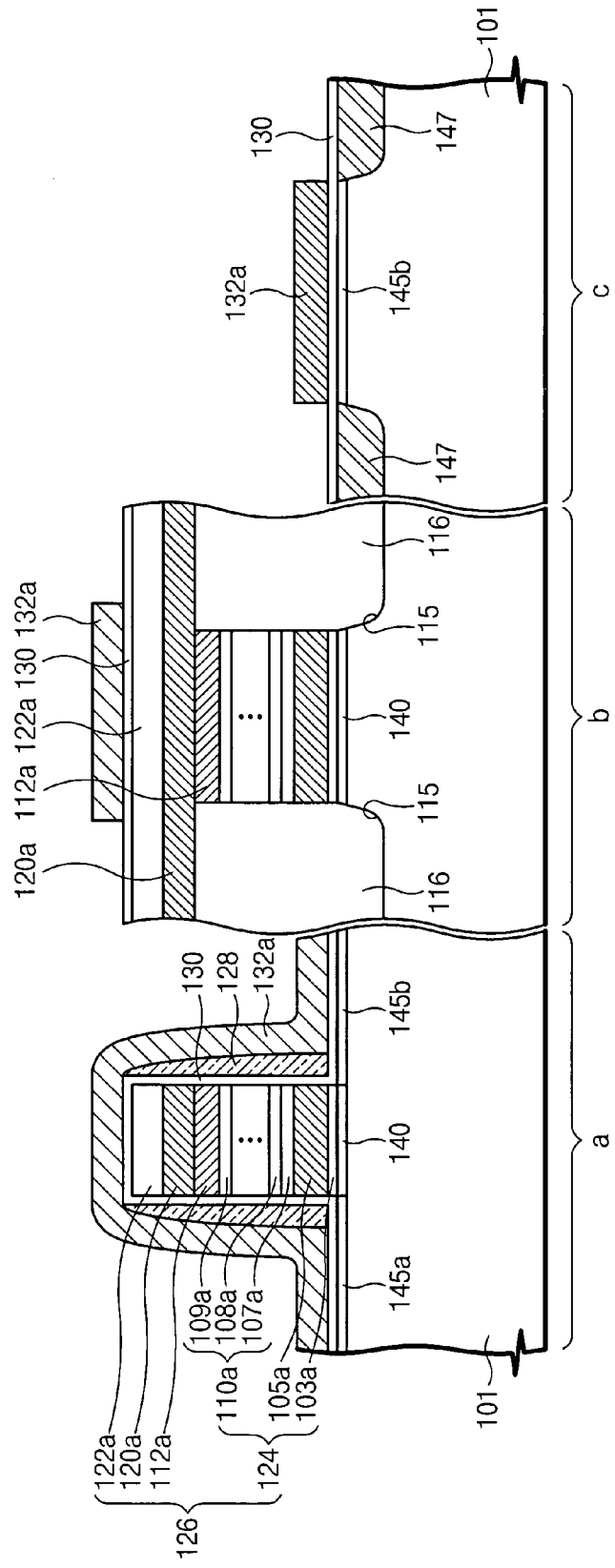
FIG. 3 is a cross-sectional view of the device of FIG. 2.

FIG. 2 is a plan view showing a memory device according to first embodiments of the present invention, which may be viewed as a novel form of a scaleable two-transistor memory (STTM) device. FIG. 3 is a cross-sectional view showing the device of FIG. 2. FIGS. 4 through 7 are cross-sectional views showing exemplary operations for forming the device of FIGS. 2 and 3. In FIGS. 3 through 7, a reference letter 'a' indicates a cross-sectional view taken along a I–I' line of the device of FIG. 2, and another reference letter 'b' indicates a cross-sectional view taken along a II–II' line of the device of FIG. 2. Yet another reference letter 'c' indicates a cross-sectional view taken along a III–III' line of the device of FIG. 2.

Referring to FIGS. 2 and 3, a memory device according to some embodiments of the present invention includes a plurality of field isolation patterns 116 defining an active region 119 on a semiconductor substrate 101. The field isolation patterns 116 have shapes of islands in the plan view of FIG. 2, and a part of the field isolation pattern 116 fills a trench 115 formed in the semiconductor substrate 101, as shown in FIG. 3. The field isolation patterns 116 are spaced from each other along column direction.

The active region 119 includes first regions 117 and second regions 118 on respective sides of the first regions 117. The second regions 118 have a linear shape and are arranged parallel to the column direction. The second regions 118 are disposed on respective sides of the field isolation patterns 116. Each of the first regions 117 is interposed between the field isolation patterns 116 and between the second regions 118. Respective sides of the first regions 117 aligned to the column direction are connected to the couple of the second regions 118.

A multiple-layer pattern 124 and a source pattern 112a are disposed on the first regions 117. The multiple layer pattern 124 includes a gate insulation pattern (gate insulator) 103a, a storage node 105a and a multiple tunnel junction barrier pattern 110a. A field isolation pattern 116 is disposed between neighboring multiple-layered patterns 124 and between neighboring source patterns 112a. The gate insulation pattern 103a may be made of silicon oxide. The storage node 105a may be made of an impurity-doped polysilicon. The multiple tunnel junction barrier pattern 110a includes alternately stacked semiconductor patterns 107a and tunnel insulation patterns 108a. A top layer 109a of the multiple tunnel junction barrier pattern 10a may be a tunnel insulation pattern 108a or a semiconductor pattern 107a. The semiconductor pattern 107a may comprise, for example, polysilicon. The tunnel insulation pattern 108a may comprise an insulation layer having a greater band gap than the semiconductor pattern 107a, for example, silicon nitride.

If the semiconductor pattern 107a comprises an impurity-doped polysilicon, impurities doped in the semiconductor pattern 107a may be a different type in comparison with those in the storage node 105a. For example, the storage node 105a may be doped with impurities of n type and the semiconductor pattern 107a may be doped with impurities of p type. If the storage node 105a is doped with impurities of p type, the semiconductor pattern 107a may be doped with impurities of n type. The source pattern 112a comprises a conductive layer, for example, an impurity-doped polysilicon layer. The source pattern 112a may be doped with impurities of the same type as those doped in the storage node 105a. The source pattern 112a may be omitted.

A data line (electrode) 120a is disposed on the source pattern 112a. The data electrode 120a extends parallel to the column direction on the plurality of the source patterns 112a. In the case that the source patterns 112a are omitted, the data line 120a may be in contact with upper surfaces of the multiple-layered patterns 124. The data line 120a comprises a conductive layer, for example, an impurity-doped polysilicon or a metal layer. A hard mask pattern 122a may be disposed on the data line 120a. The hard mask pattern 122a may be made of silicon nitride. The multiple-layered pattern 124, the source pattern 112a, the data line 120a and the hard mask pattern 122a form a gate pattern 126.

Still referring to FIGS. 2 and 3, a control line (electrode) 132a is disposed on and crosses over the gate pattern 126. The control line 132a is disposed on sidewalls of the multiple-layered pattern 124a and crosses over the second regions 118. A first portion (a first gate insulator) of the gate interlayer dielectric layer 130 is interposed between the control line 132a and the multiple tunnel junction barrier pattern 110a, and a second portion (a second gate insulator)

of the gate interlayer dielectric layer 130 is interposed between the control line 132a and a portion of the substrate 101 adjacent the gate pattern 126. The control line 132a may comprise a conductive layer, for example, an impurity-doped polysilicon or a polycide. The gate interlayer dielectric layer 130 may comprise silicon oxide. A spacer 128 may be disposed between the control line 132a and the gate interlayer dielectric layer 130 on sidewalls of the gate pattern 126. The spacer 128 may be disposed on the gate interlayer dielectric layer 130 opposite sidewalls of the multiple-layered pattern 124. The spacer 128 may comprise a conductive layer, for example, an impurity-doped polysilicon.

The storage node 105a, the multiple tunnel junction barrier pattern 110a, the source pattern 112a, the insulation layer 130, the spacer 128 and the control line 132a, and the data line 120a make up a vertical transistor. The spacer 128 and the control line 132a disposed on the sidewalls of the multiple tunnel junction barrier pattern 110a serve as a gate electrode of the vertical transistor. Sidewalls of the multiple tunnel junction barrier pattern 10a correspond to channel regions of the vertical transistor.

The storage node 105a, the gate insulator 103a, and a planar channel region 140 in the substrate 101 underlying the multiple-layered pattern 124 and first and second regions in the substrate 101 are parts of a first planar transistor. Regions 145a, 145b in the substrate 101 may be viewed as source/drain regions for the first planar transistor, as they serve as terminals of the channel region 140. The regions 145a, 145b may also be viewed as a channel of a second planar transistor for which portions of the control line 132 that are disposed on the regions 145a, 145b serve as a gate electrode. The conductivity of the channel region 140 is dependent on the amount of charge on the storage node 105a of the vertical transistor, which determines the threshold voltage of the first planar transistor. For example, an "erased" threshold voltage is a threshold voltage that makes the planar channel region 140 take on an inversion state when electrons are absent in the storage node 105a. A "programmed" threshold voltage is higher than the erased threshold voltage.

As noted, the source/drain regions 145a and 145b in portions of the substrate underlying the horizontal portions of the control line 132a may be viewed as channel regions of an additional planar transistor that is controlled by voltage applied to the control line 132a, which serves as a gate electrode. When a sufficiently high voltage is applied to the control line 132a, these "channel" or "source/drain" regions 145a and 145b transition to an "on" state. The regions 145a and 145b are not required to be conventional impurity-doped regions. The regions 145a and 145b can, therefore, have a shallower depth in comparison with conventional impurity-doped source/drain regions. This configuration can prevent undesirable behavior, such as punch-through.

Voltages applied to the control line 132a that make the source/drain regions 145a and 145b transition to inversion states ("on" states) are defined as source/drain threshold voltages. The source/drain threshold voltages are preferably lower than the programmed and erased threshold voltages. Additionally, the source/drain threshold voltages are preferably lower than a vertical channel threshold voltage that turns on the vertical channel region. The vertical channel threshold voltage is preferably higher than the programmed threshold voltage. The vertical channel threshold voltage may be kept higher than the source/drain threshold voltage due to the multiple tunnel junction barrier pattern 110a.

The storage node 105a, the source pattern 112a and the control line 120a may be doped with impurities of a first conductivity type. The semiconductor pattern 109a and the spacer 128 may be doped with impurities of a second conductivity type. Therefore, a work function of the spacer 128 is substantially the same as that of the semiconductor pattern 109a, which is a part of the vertical channel region. This can increase the vertical channel threshold voltage.

Impurity-doped regions 147 are disposed in the second regions 118 at respective sides of the control line 132a. The respective impurity-doped regions 147 contact respective ones of the regions 145a, 145b. The respective impurity-doped regions 147 and respective regions 145a, 145b connected thereto may serve, respectively, as a bit line and a bit bar line. That is, the region 145a or the region 145b and the impurity-doped regions 147 in one of the second regions 118 correspond to a bit line, and those in the other of the second regions 118 correspond to a bit bar line.

The device described above may be operated as follows. To program the device, a vertical gate voltage is applied to the control line 132a, and a program voltage is applied to the data line 120a. The vertical gate voltage is substantially equal to or greater than the vertical channel threshold voltage. Thus, the vertical channel region is turned on such that electrons at the data line 120a flow into the storage node 105a. The vertical channel region is then turned off by removing the vertical gate voltage. As a result, electrons are stored in the storage node 105a. To erase the device, a vertical gate voltage is applied to the control line 132a and an erase voltage is applied to the data line 120a. Thus, electrons stored in the storage node 105a flow to the data line 120a through the vertical channel region.

To read the device, a sensing voltage is applied to a selected one of the control lines 132a, while the other unselected control lines 132a are kept at voltages less than the sensing voltage. A predetermined voltage (e.g., a power supply voltage) is applied to a bit line of a selected cell accessed by the selected control line, and a reference voltage (e.g., a ground voltage) is applied to a bit bar line of the selected cell. Thus, the "channel" or "source/drain" regions 145a and 145b of the selected cell are turned on. The sensing voltage is higher than the erased threshold voltage and lower than the programmed threshold voltage. In the case that the selected cell is in the programmed state, the bit line and the bit bar line are electrically isolated from each other. In the case that the selected cell is in the erased state, the bit line and the bit bar line are electrically connected to each other.

Figure 4:
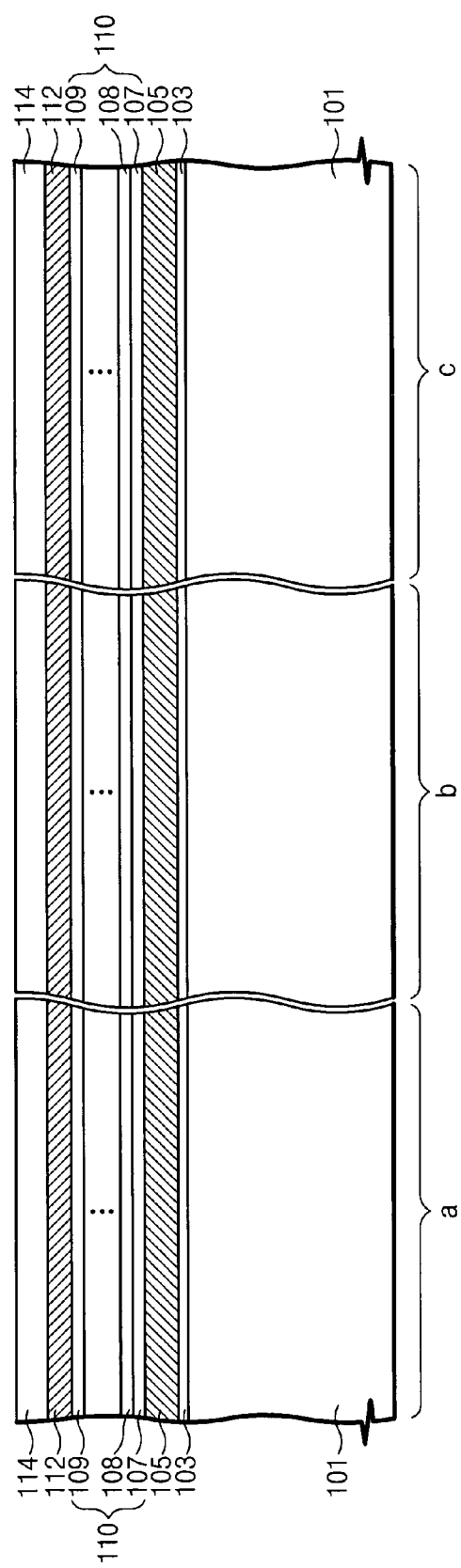
FIGS. 4–7 are cross-sectional views showing exemplary operations for forming the device of FIGS. 2 and 3.

The device of FIG. 3 may be formed as illustrated in FIGS. 4 through 7. Referring to FIG. 4, a gate insulation layer 103, a storage conductive layer 105, a multiple tunnel junction barrier layer 110, a source conductive layer 112 and a first hard mask layer 114 are sequentially formed on a semiconductor substrate 101. The gate insulation layer 103 may comprise a silicon oxide, for example, a thermal oxide. The storage conductive layer 105 may be formed of an impurity-doped polysilicon. The multiple tunnel junction barrier layer 110 may be formed by alternately stacking semiconductor layers 107 and tunnel insulation layers 109. The top layer 109 of the multiple tunnel junction barrier layer 110 may be a semiconductor layer 107 or a tunnel insulation layer 108. The semiconductor layer 107 may comprise impurity-doped polysilicon. The tunnel insulation layer 108 may be an insulation layer having a greater energy band gap than the semiconductor layer 107, for example, a silicon nitride layer. The source conductive layer 112 may comprise impurity-doped polysilicon. The source conductive layer 112 may be omitted. The first hard mask layer 114 may comprise silicon nitride.

Figure 5:
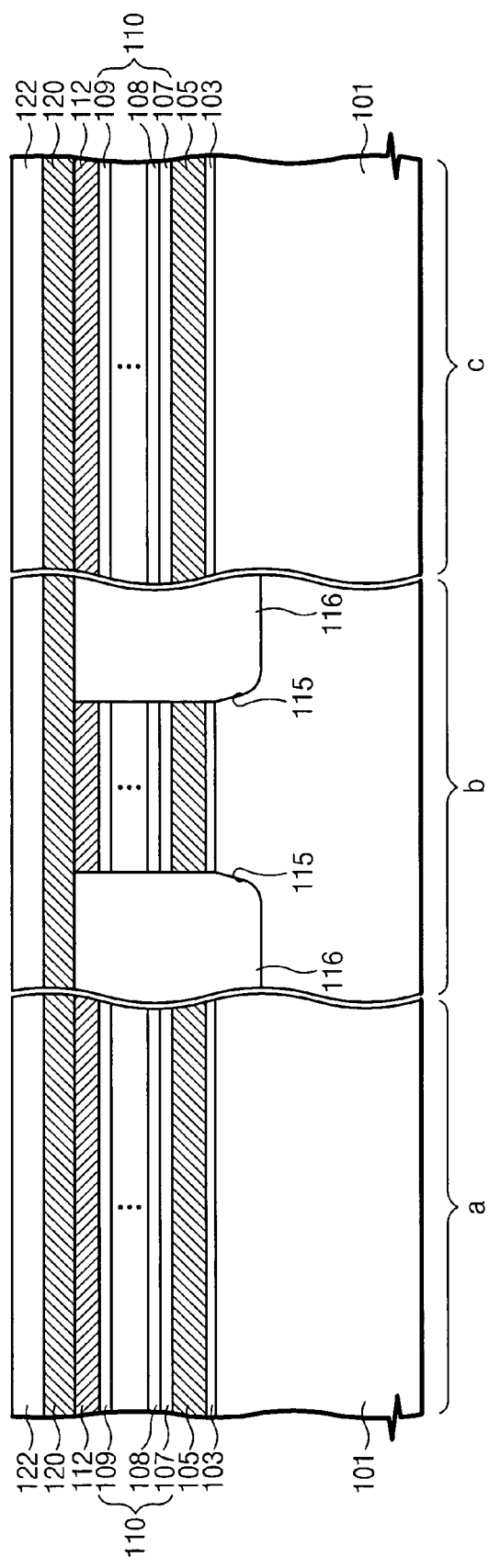

Referring to FIGS. 2 and 5, the first hard mask layer 114, the source conductive layer 112, the multiple tunnel junction barrier layer 110a, the storage conductive layer 105, the gate insulation layer 103 and the semiconductor substrate 101 are patterned to form trenches 115 defining the active region 119. The trenches 115 are spaced apart from each other along a column direction. The active region 119 is divided into a plurality of first regions 117 and two, second regions 118. The first regions 117 are disposed between neighboring trenches 115. The second regions 118 are connect to respective sides of the first regions 117. The second regions 118 extend along the column direction.

A field isolation pattern 116 is formed in the trenches 115. The field isolation pattern 116 may comprise, for example, a silicon oxide. The first hard mask layer 114 is etched to expose the source conductive layer 112. The first hard mask layer 114 may removed by a chemical mechanical polishing process. An upper part of the field isolation pattern 116 may be removed such that upper surfaces of the exposed source conductive layer 112 and the field isolation pattern 116 may have the same height.

A conductive layer 120 and a second hard mask layer 122 are sequentially formed on the semiconductor substrate 101 having the exposed source conductive layer 112 thereon. The conductive layer 120 may comprise an impurity-doped polysilicon, a metal or a polycide layer. The second hard mask layer 122 may comprise a silicon nitride layer.

Figure 6:
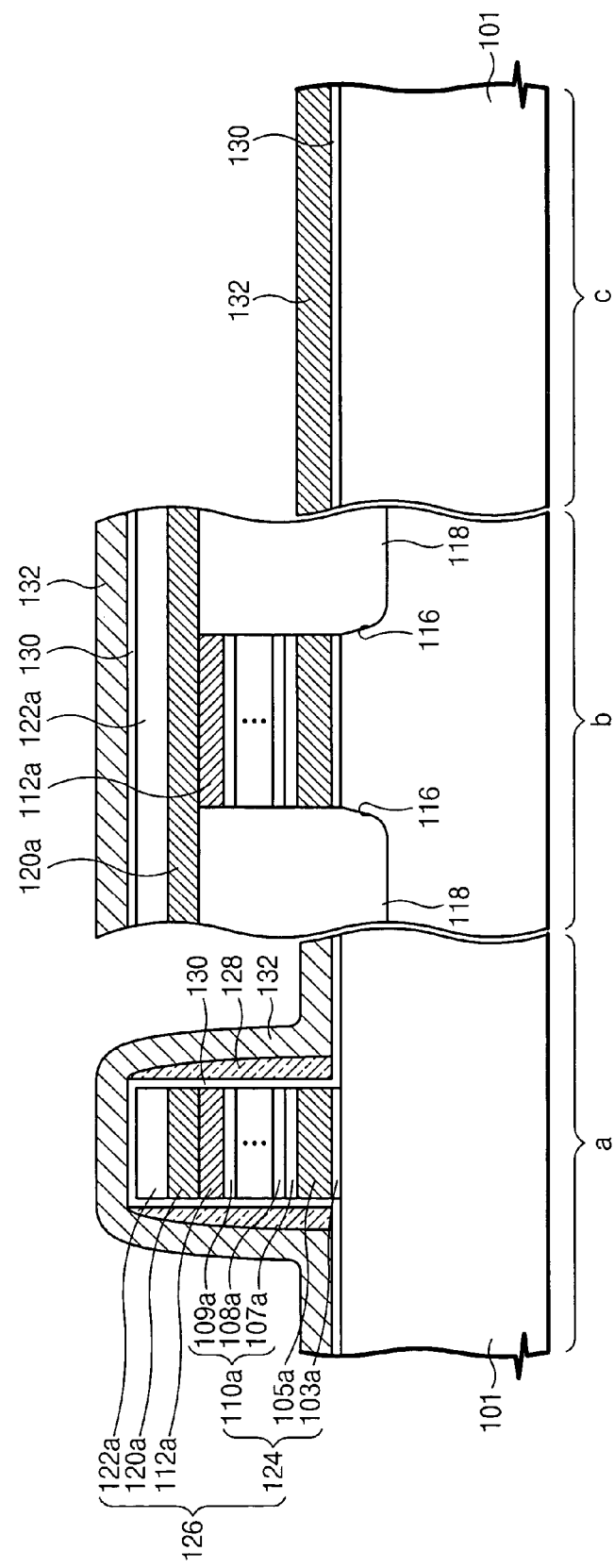

Referring to FIG. 6, the second hard mask layer 122, the conductive layer 120, the source conductive layer 122, the multiple tunnel junction barrier layer 110, the storage conductive layer 105 and the gate insulation layer 103 are patterned to form a gate pattern 126. The gate pattern 126 includes a multiple-layered pattern 124, a source pattern 112, a data line 120a and a hard mask pattern 122a in a stack formation. The multiple-layered pattern 124 and the source pattern 112a are disposed between neighboring field isolation patterns 116. The data line 120a is in contact with upper surfaces of the source patterns 112a along the column direction. The data line 120a extends parallel to the second regions 118. The multiple-layered pattern 124 includes a gate insulation pattern 103a, a storage node 105a and a multiple tunnel junction barrier pattern 110a. The multiple tunnel junction barrier pattern 110a includes alternately stacked semiconductor patterns 107a and tunnel insulation patterns 108a. A top layer 109a of the multiple tunnel junction barrier pattern 110a may be a semiconductor pattern 107a or a tunnel insulation pattern 108a. In the case that the source pattern 112a is omitted, the data line 120a is in contact with an upper surface of the multiple tunnel junction barrier pattern 110a.

A gate interlayer dielectric layer 130 is formed on the semiconductor substrate 101 having the gate pattern 126 thereon. The gate interlayer dielectric layer 130 may comprise silicon oxide. For example, the gate interlayer dielectric layer 130 may be formed by chemical vapor deposition (CVD) of silicon oxide or by thermal oxidation of silicon.

A spacer 128 is formed on the gate interlayer dielectric layer 130 on sidewalls of the gate pattern 126. The spacer 128 may comprise a conductive material, for example, an impurity-doped polysilicon. The spacer 128 may be doped with impurities of the type same as the semiconductor patterns 107a. The spacer 128 may be omitted in some embodiments.

A conductive layer 132 is formed on the semiconductor substrate 101 having the spacer 128 thereon. The conductive layer 132 may comprise, for example, an impurity-doped polysilicon, a metal or a polycide. In the case that the control conductive layer 132 is formed of an impurity-doped polysilicon, the control conductive layer 132 may be doped with impurities of a type different from those used to dope the spacer 128.

Figure 7:
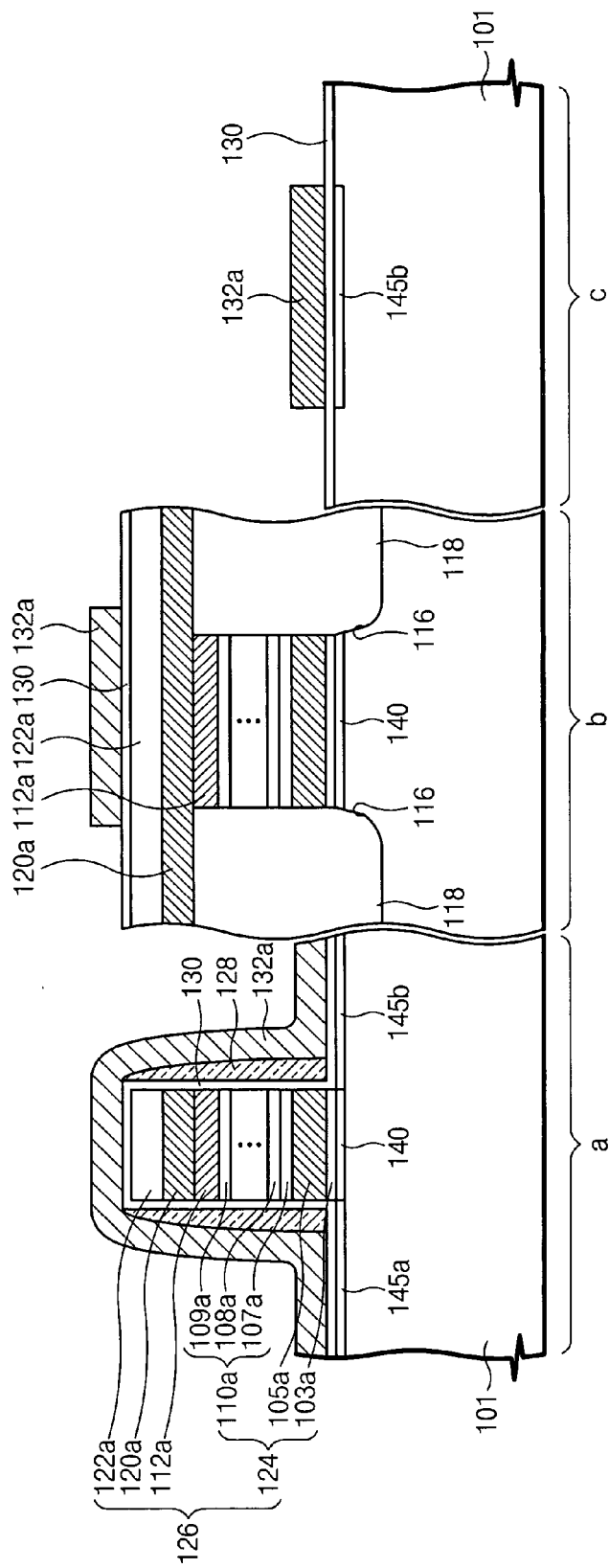

Referring to FIGS. 2 and 7, the conductive layer 132 is patterned to form a control line 132a crossing over the gate pattern 126 and extending on to portions of the gate interlayer dielectric layer 130 adjacent thereto, thus defining the "channel" or "source/drain" regions 145a, 145b in the substrate 101. The control line 132a covers the hard mask pattern 122a and sidewalls of the multiple-layered pattern 110a disposed on the first region 117. The hard mask pattern 122a and the gate interlayer dielectric layer 130 isolate the data line 120a and the control line 132a. The source/drain regions 145a and 145b are in contact with both sides of a planar channel region 140 in the substrate 101 under the multiple-layered pattern 124. The source/drain regions 145a and 145b are disposed at a surface of the active region 119 and are not required to be conventional impurity-doped regions. Thus, it is possible to prevent degradation of a property such as a punch through between conventional source/drain regions. Impurity-doped regions 147, illustrated in FIGS. 2 and 3, are formed by implanting impurity ions using the control line 132 as an ion-implantation mask.

Second Embodiments

Figure 8:
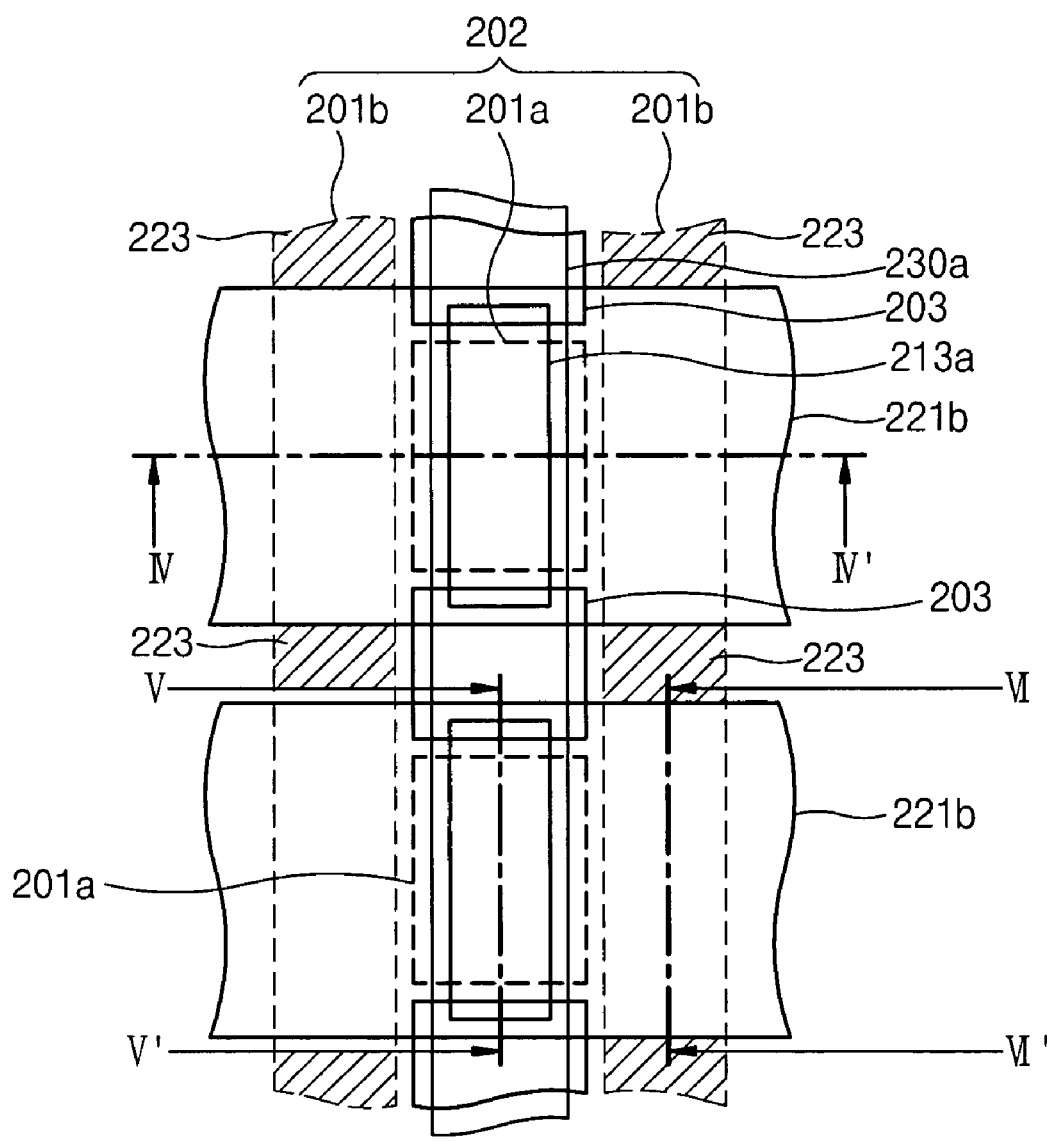
FIG. 8 is a plan view showing a memory device according to further embodiments of the present invention.
Figure 9:
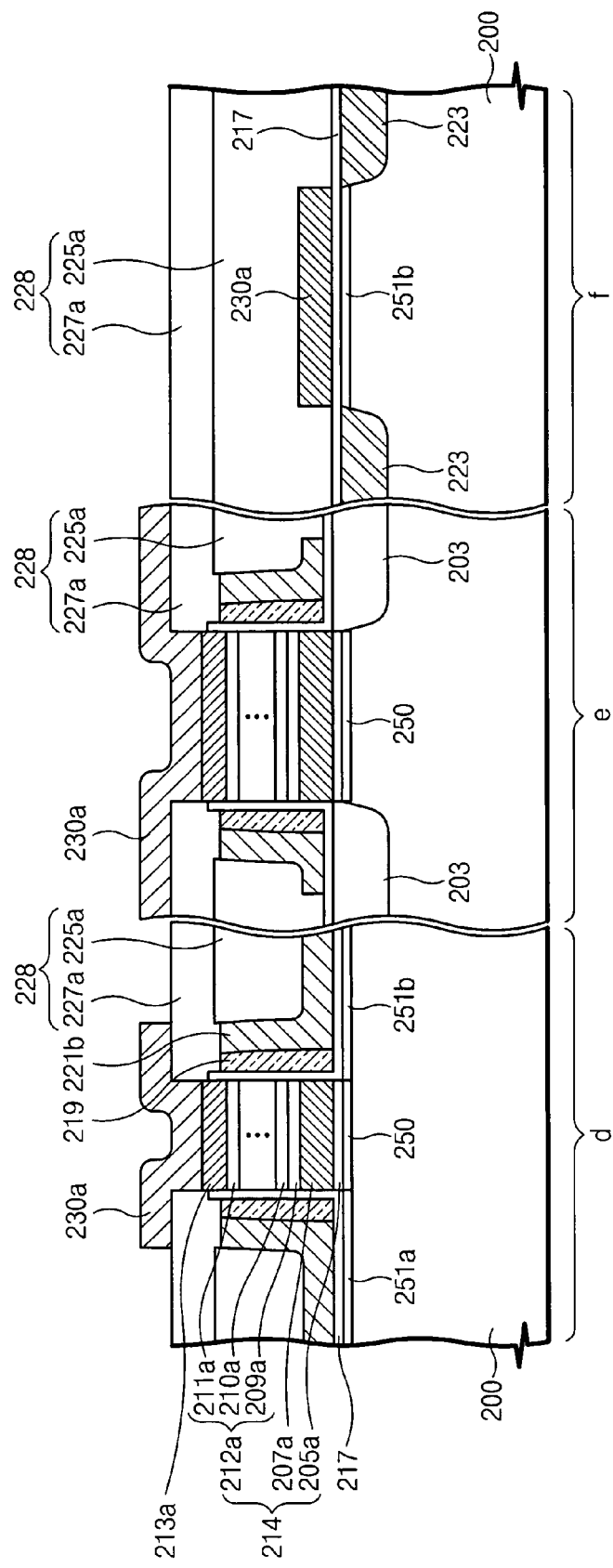
FIG. 9 is a cross-sectional view of the device of FIG. 8.

FIG. 8 is a plan view showing a memory device according to further embodiments of the present invention. FIG. 9 is a cross-sectional view of the device of FIG. 8. FIGS. 10 through 15 are cross-sectional views showing operations for forming the device of FIGS. 8 and 9. In FIGS. 9 through 15, a reference letter 'd' indicates a cross-sectional view taken along a IV–IV' line of the device of FIG. 8, a reference letter 'e' indicates a cross-sectional view taken along a V–V' line of the device of FIG. 8, and a reference letter 'f' indicates a cross-sectional view taken along a VI–VI' line of the device of FIG. 8.

Referring to FIGS. 8 and 9, a device according to second embodiments of the present embodiment includes a plurality of field isolation patterns 203 defining an active region 202 on a semiconductor substrate 200. The field isolation patterns 203 comprise a plurality of islands. The field isolation patterns 203 are spaced from each other along a column direction. The active region 202 includes first regions 201a interposed between the field isolation patterns 203 and a second regions 201b. The second regions 201b are parallel to each other and in contact with respective sides of the first region 201.

A multiple-layered pattern 214 and a source pattern 213a are stacked on the first region 201a. The multiple-layered pattern 214 includes a gate insulation pattern 205a, a storage node 207a and a multiple tunnel junction barrier pattern 212a. The gate insulation pattern 205a may comprise silicon oxide. The storage node 207a may comprise an impurity-doped polysilicon. The multiple tunnel junction barrier pattern 212a includes semiconductor patterns 209a and tunnel insulation patterns 210a which are alternatively stacked. An utmost top layer 211a of the multiple tunnel junction barrier pattern 212a may be a semiconductor pattern 209a or a tunnel insulation pattern 210a. The semiconductor pattern 209a may comprise an impurity-doped polysilicon. The tunnel insulation pattern 210a may comprise an insulation layer having a greater bandgap than the semiconductor pattern 209a, for example, a silicon nitride layer. The source pattern 213a may comprise an impurity-doped polysilicon. The source pattern 213a may be omitted.

A control line (electrode) 221b is disposed on a sidewall of the multiple-layered pattern 214 and on an adjacent portion of the substrate 200. A gate interlayer dielectric layer 217 is interposed between the control line 221b and the multiple-layered pattern 214 and between the control line 221b and the substrate 200. The control line 221b may comprise, for example, an impurity-doped polysilicon or a polycide. The gate interlayer dielectric layer 217 may comprise silicon oxide. A spacer 219 may be interposed between the control line 221b and the gate interlayer dielectric layer 217 on sidewalls of the multiple-layered pattern 214. The spacer 219 may comprise a conductive layer, for example, an impurity-doped polysilicon.

A mold layer 228 is disposed to cover the semiconductor substrate 200 having the structure described above, exposing an upper surface of the source pattern 213a. The mold layer 228 may include stacked first and second interlayer dielectric layers 225a and 227a. An upper surface of the mold layer 228 may be higher than an upper surface of the source pattern 213a.

A data line (electrode) 230a is disposed on the upper surface of the source pattern 213a. The data line 230a is in contact with upper surfaces of the plurality of the source patterns 213a, which are arranged along the column direction. The data line 230a comprises a conductive layer, for example, an impurity-doped polysilicon, a metal or a polycide. In the case that the source pattern 213a is omitted, the data line 230a is in contact with an upper surface of the multiple tunnel junction barrier pattern 212a.

The surface of the active region 202 under the multiple-layered pattern 214 corresponds to a planar channel region 250. Source/drain (or channel) regions 251a and 251b are defined at respective sides of the planar channel region 250, underlying portions of the control line 221b. If a source/drain threshold voltage is applied to the control line 221b, the source/drain regions 251a and 251b are turned "on" (an inversion state). If not, the source/drain regions 251a and 251b are turned "off." Consequently, it is possible to prevent a degradation of a property such as a punch through between conventional source/drain regions due to the source/drain regions 251a and 251b. Impurity-doped regions 223 are disposed at the second regions 201b at respective sides of the control line 221b.

A vertical transistor includes the storage node 207a, the multiple tunnel junction barrier pattern 212a, the insulator 217, the source pattern 213a, the spacer 219 and a vertical portion of the control line 221b, and is coupled to the data line 230a. A first planar transistor includes the storage node 207a and a planar channel region 250. A second planar transistor comprises the regions 251a and 251b and is controlled by portions of the control line 221b. The impurity-doped regions 223 in one of the coupled second regions 201b compose a bit line. Those in the other of the coupled second regions 201b compose a bit bar line. If sufficient charge is present in the storage node 207a, a threshold voltage applied to the control line 221b is a programmed threshold voltage. If not, a threshold voltage applied to the control line 221b is an erased threshold voltage. A threshold voltage of the vertical transistor is a vertical channel threshold voltage. A voltage of the control line 221b, which making the source/drain regions 251a and 251b turn-on states is defined as a source/drain threshold voltage.

The source/drain threshold voltage is preferably lower than the erased and programmed threshold voltages. Additionally, the source/drain threshold voltage is preferably lower than the vertical channel threshold voltage. Otherwise, the storage node 207a, the source pattern 213a (or the data line 230a) and the control line 221b are doped with impurities of a first conductivity type. The semiconductor pattern 209a and the spacer 219 may be doped with impurities of a second conductivity type. This can further increase the vertical channel threshold voltage. In the device described above, the data line 230a is disposed on the control line 221b. The device may be operated in the same method with the first embodiments.

Figure 10:
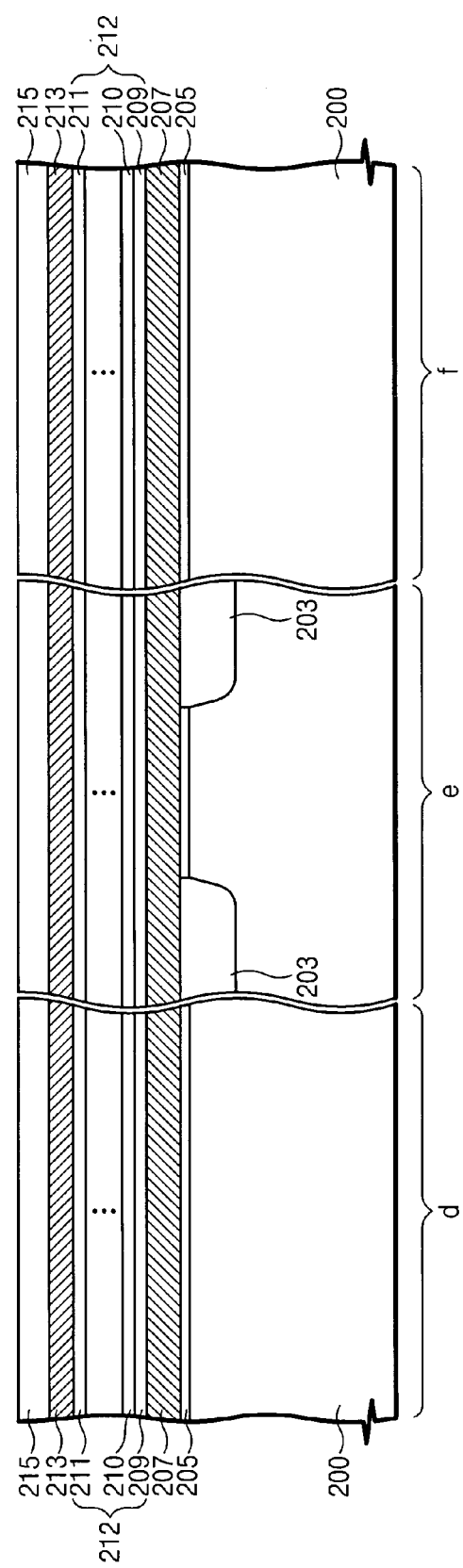
FIGS. 10–15 are cross-sectional views showing exemplary operations for forming the device of FIGS. 8 and 9.

The device may be formed as shown in FIGS. 10 through 15. Referring to FIGS. 8 and 10, a plurality of field isolation patterns 203 is formed in a semiconductor substrate 200 to define an active region 202. The field isolation patterns 203 are spaced from each other along a column direction. The active region 202 includes first regions 201a interposed between the neighboring field isolation patterns 203 and second regions 201b in contact with respective sides of the first region 201a.

A gate insulation layer 205, a storage conductive layer 207, a multiple tunnel junction barrier layer 212, a source conductive layer 213 and a hard mask layer 215 are sequentially formed on he semiconductor substrate 200 having the field isolation patterns 203 therein. The gate insulation layer 205 may comprise silicon oxide. The storage conductive layer 207 may comprise impurity-doped polysilicon. The multiple tunnel junction barrier layer 212 includes semiconductor layers 209 and tunnel insulation layers 210 which are alternately stacked. A top layer 211 of the multiple tunnel junction barrier layer 212 may be a semiconductor layer 209 or a tunnel insulation layer 210. The semiconductor layer 209 may comprise impurity-doped polysilicon. The tunnel insulation layer 210 may comprise an insulation layer having a greater energy band gap than the semiconductor layer 209, for example, a silicon nitride layer. The source conductive layer 213 may comprise impurity-doped polysilicon. The hard mask layer 215 may comprise silicon nitride.

Figure 11:
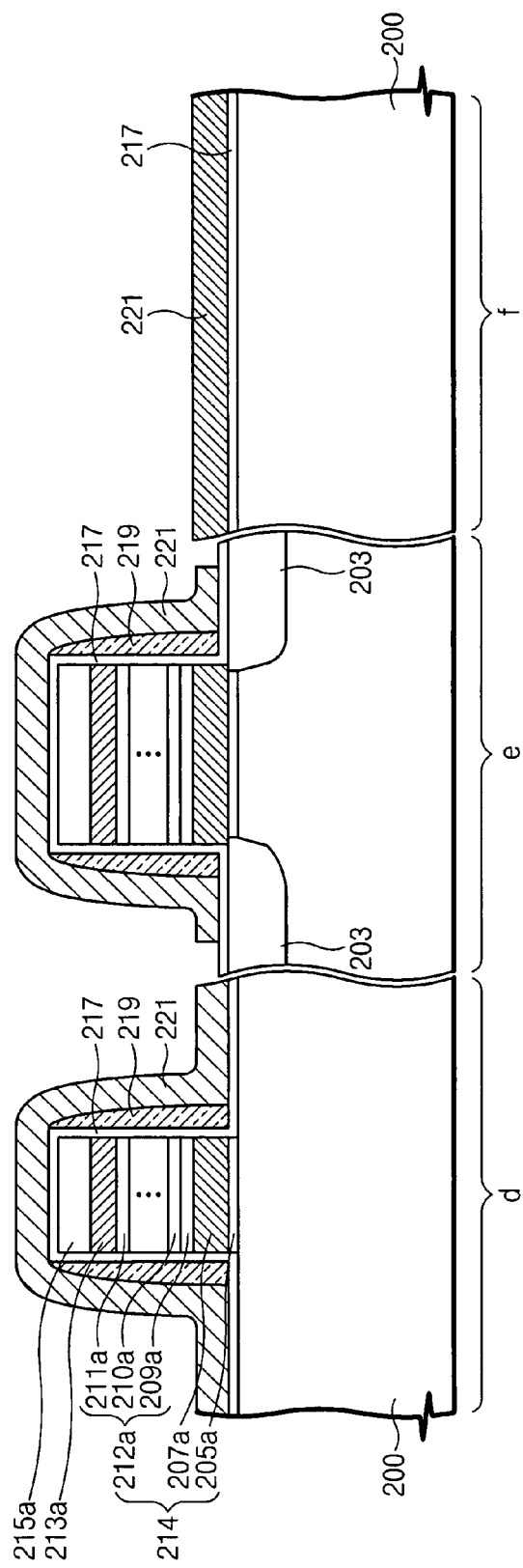

Referring to FIGS. 8 and 11, the hard mask layer 215, the source conductive layer 213, the multiple tunnel junction barrier layer 212, the storage conductive layer 207 and the gate insulation layer 205 are patterned to form a multiple-layered pattern 214, a source pattern 213a and a hard mask pattern 215a stacked on the first region 201a. The multiple-layered pattern 214 includes a gate insulation pattern 205a, a storage node 207a and a multiple tunnel junction barrier pattern 212a. The multiple tunnel junction barrier pattern 212a includes semiconductor patterns 209a and tunnel insulation patterns 210a, which are alternately stacked.

A gate interlayer dielectric layer 217 is formed on the semiconductor substrate 200 having the patterns 214, 213a and 215a thereon. The gate interlayer dielectric layer 217 may comprise silicon oxide. Spacers 219 are formed on the gate interlayer dielectric layer 217 on sidewalls of the patterns 214, 213a and 215a. The spacers 219 may comprise a conductive layer, for example, an impurity-doped polysilicon.

A conductive layer 221 is formed on the semiconductor substrate 200 having the spacers 219 thereon. The conductive layer 221 may comprise an impurity-doped polysilicon. The semiconductor patterns 209a and the spacers 219 may comprise polysilicon doped with impurities with a first conductivity type, and the conductive layer 221 may comprise polysilicon doped with impurities with a second conductivity type. Thus, a vertical channel threshold voltage, which is a threshold voltage of a vertical transistor, may be increased.

Figure 12:
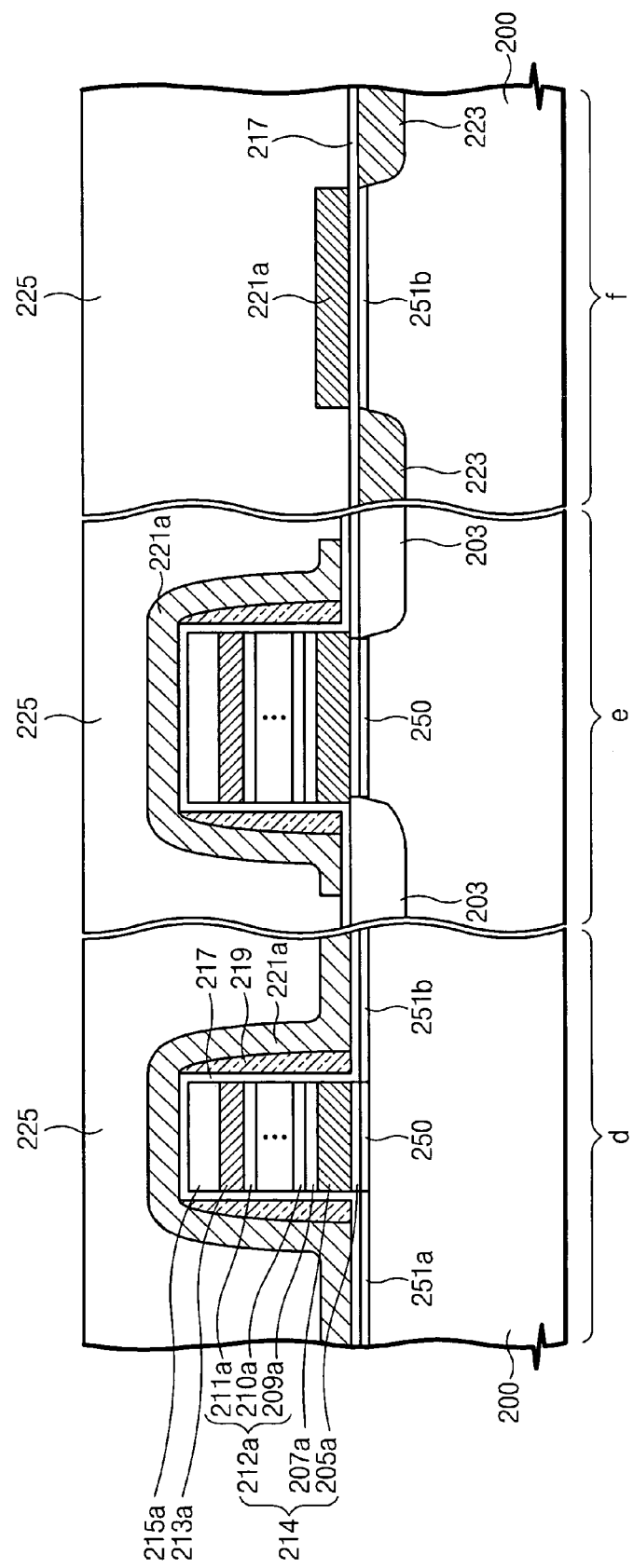
Figure 13:
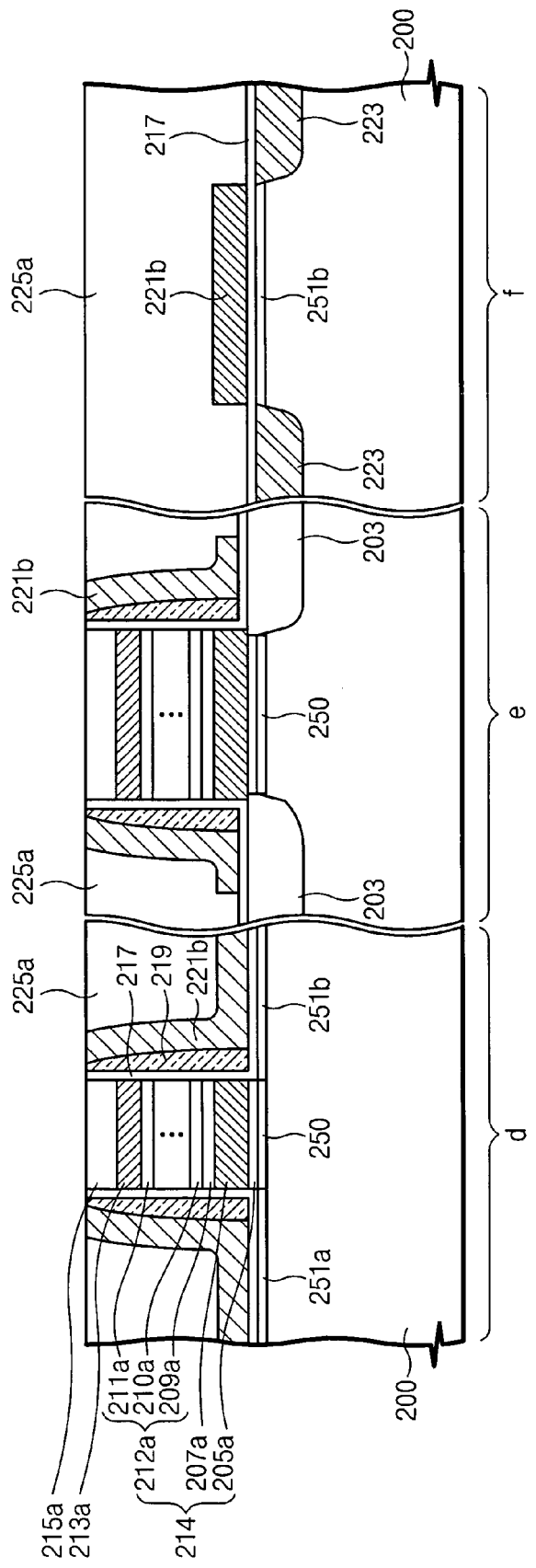

Referring to FIGS. 8, 12 and 13, the conductive layer 221 is patterned to form a preliminary control line 221 on a sidewall of the multiple-layered pattern 214, on the source pattern 213a and on the hard mask pattern 215a, defining source/drain regions 251a and 251b on respective sides of the multiple-layered pattern 214. The source/drain regions 251a and 251b are portions of the active region 202 under horizontal portions of the preliminary control line 221a. The source/drain regions 251a and 251b are connected to both sides of a planar channel region 150 under the multiple-layered pattern 212a. The source/drain regions 251a and 251b are located at surfaces of the active regions 202 and are not required to be conventional impurity-doped regions.

Impurity-doped regions 223 are formed at the second regions 201b at respective sides of the preliminary control line 221a by implanting impurity ions using the preliminary control line 221a as an ion-implantation mask. The impurity-doped regions 223 compose a part of a bit line or a bit bar line. A first interlayer dielectric layer 225 is formed on the semiconductor substrate 200 having the impurity-doped region 223 therein. The first interlayer dielectric layer 225 may comprise silicon oxide.

The first interlayer dielectric layer 225, the preliminary control line 221a and the gate interlayer dielectric layer 217 are planarized until the hard mask pattern 215a is exposed, thereby forming a control line 221b. Due to the planarization process, a part of the control line 221b and a part of the spacer 219 between the planarized interlayer dielectric layer 225a and the hard mask pattern 215a are exposed. The source/drain regions 251a and 251b are turned on (take on an inversion state) if a predetermined voltage is applied to the control line 221b.

Figure 14:
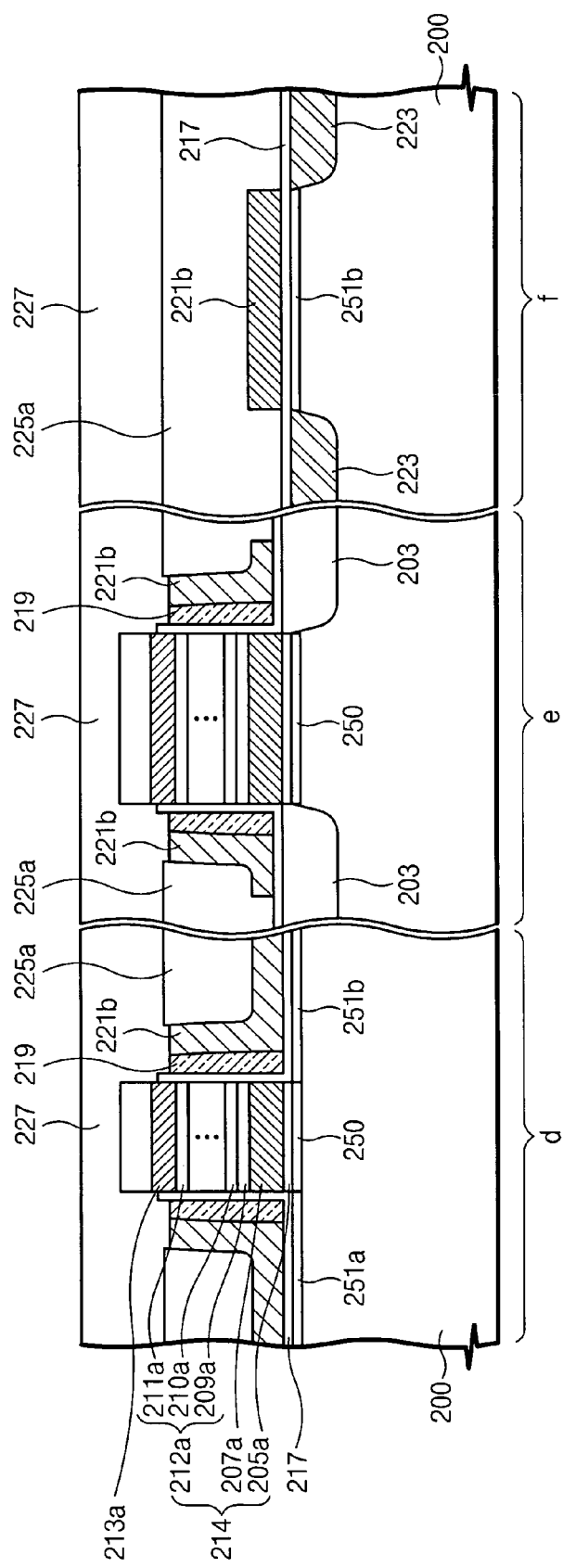

Referring to FIG. 14, the exposed control line 221b and the spacer 219 are selectively recessed. Thus, upper surfaces of the recessed control line 221b and the spacer 219 are lower than an upper surface of the hard mask pattern 215a. The planarized interlayer dielectric layer 225a is selectively recessed. At this time, an upper surface of the recessed interlayer dielectric layer 225a may be higher than that of the recessed control line 221b.

Figure 15:
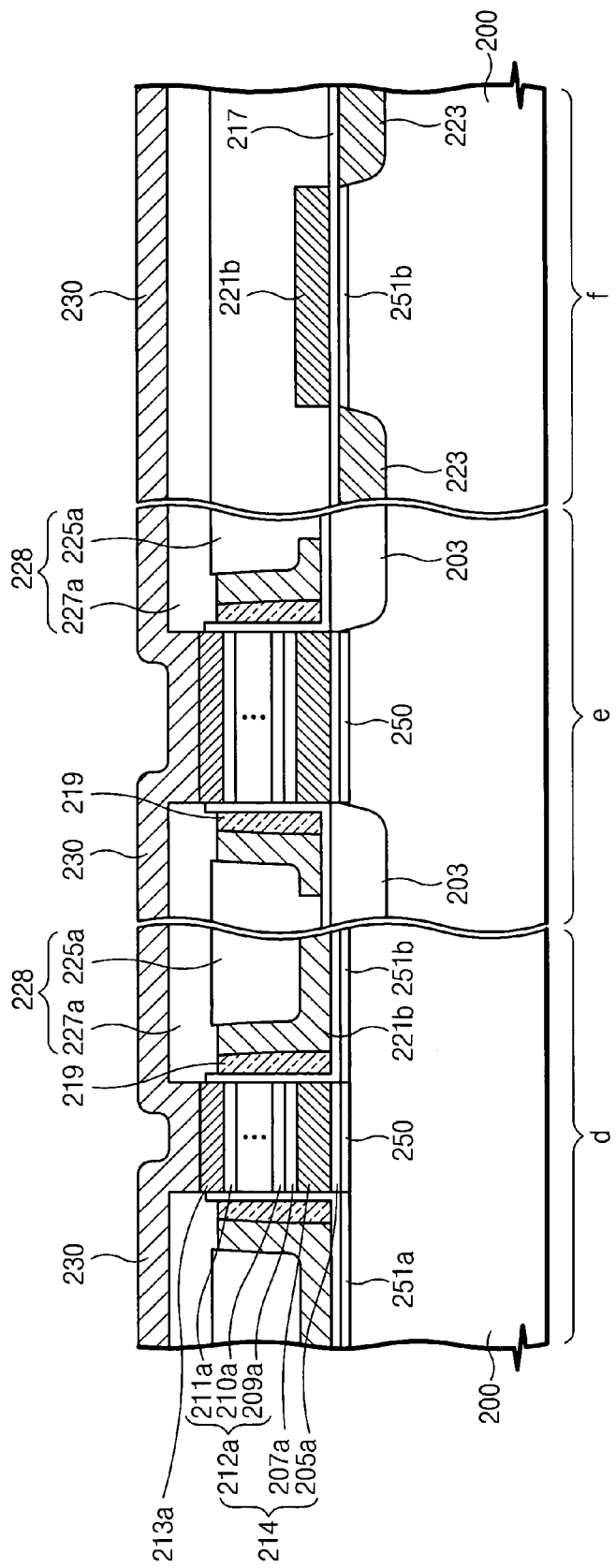

A second interlayer dielectric layer 227 is formed on the semiconductor substrate 200. The second interlayer dielectric layer 227 may comprise silicon oxide. Referring to FIG. 15, the second interlayer dielectric layer 227 is planarized to expose an upper surface of the hard mask pattern 215a. The recessed first interlayer dielectric layer 225a and the planarized second interlayer dielectric layer 227a form a mold layer 228. The exposed hard mask pattern is selectively etched until the source pattern 213a is exposed, forming a groove whose sidewall is the mold layer 228 and whose bottom surface is an upper surface of the source pattern 213a. A conductive layer 230 is formed on the semiconductor substrate 200 to fill the groove. The conductive layer 230 may comprise an impurity-doped polysilicon, a metal or a polycide. The data conductive layer 230 is patterned to form a data line 230a as illustrated in FIGS. 8 and 9.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A memory device comprising:
   a semiconductor substrate;
   a first gate insulator on a first portion of a semiconductor substrate;
   a storage node on the first gate insulator;
   a tunnel junction baffler on the storage node;
   a data electrode on the tunnel junction barrier;
   a second gate insulator on a sidewall of the tunnel junction barrier;
   a third gate insulator on a second portion of the substrate adjacent the tunnel junction barrier;
   a gate electrode on the second gate insulator and the third gate insulator; and
   first and second impurity-doped regions in the substrate coupled by a channel through the first and second portions of the substrate.

2. A memory device according to claim 1, wherein the storage node is on a first channel in the first portion of the substrate, and wherein the gate electrode is on a second channel in the second portion of the substrate that couples the first channel to the first impurity-doped region.

3. A memory device according to claim 2, wherein the second channel is configured to serve as a source/drain for the first channel.

4. A memory device according to claim 1, further comprising a fourth gate insulator on a second sidewall of the tunnel junction barrier and a fifth gate insulator on a third portion of the substrate between the tunnel junction barrier and the second impurity-doped region, and wherein the gate electrode is disposed on the fourth and fifth gate insulators.

5. A memory device according to claim 4, wherein the gate electrode is on a third channel region in the third portion of the substrate that couples the first channel to the second impurity-doped region.

6. A memory device according to claim 5, wherein the third channel is configured to serve as a source/drain for the first channel.

7. A memory device according to claim 4, wherein the second, third, fourth and fifth gate insulators comprise respective portions of a continuous insulation layer conforming to a top of the data electrode and to the sidewalls of the tunnel junction barrier and to surfaces of the substrate adjacent thereto, and wherein the gate electrode comprises a continuous conductive layer overlying the continuous insulation layer.

8. A memory device according to claim 7, wherein the gate electrode further comprises conductive sidewall spacers interposed between the portions of the second insulation layer on the sidewalls of the tunnel junction barrier and the continuous conductive layer.

9. A memory device according to claim 1, wherein the second and third gate insulators comprise respective portions of a continuous insulation layer conforming to the sidewall of the tunnel junction barrier and to a surface of the second portion of the substrate, and wherein the gate electrode comprises a continuous conductive layer overlying the continuous insulation layer.

10. A memory device according to claim 9, wherein the gate electrode further comprises a conductive sidewall spacer interposed between the portion of the second insulation layer on the sidewall of the tunnel junction barrier and the continuous conductive layer.

11. A memory device according to claim 10, further comprising an insulation layer on the data electrode, and wherein the gate electrode comprises a portion on the insulation layer on the data electrode.

12. A memory device according to claim 10, wherein the gate electrode comprises a continuous conductive layer overlying the second and third gate insulators and the data electrode.

13. A memory device, comprising:

a semiconductor substrate;

a tunnel junction barrier transistor having a storage node on the substrate, a tunnel junction barrier on the storage node, and a gate electrode on a sidewall of the tunnel junction barrier that controls a channel of the tunnel junction barrier transistor;

a first planar transistor having a first channel in the substrate disposed transverse to the channel of the tunnel junction barrier transistor and controlled by the storage node of the tunnel junction barrier transistor; and a second planar transistor having a second channel in the substrate disposed adjacent to the first planar transistor and transverse to the channel of the tunnel junction barrier transistor and having a gate electrode electrically coupled to the gate electrode of the tunnel junction barrier transistor.

14. A memory device according to claim 13, wherein the gate electrodes of the tunnel junction barrier transistor and the second planar transistor comprise a continuous conductive layer having a first portion on the sidewall of the tunnel junction barrier and a second portion that extends transverse to the first portion onto the channel of the second planar transistor.

15. A memory device according to claim 13, wherein the second planar transistor comprises second channels on respective sides of the first channel.

16. A memory device according to claim 15, wherein the gate electrodes of the tunnel junction barrier transistor and the second planar transistor comprise a first continuous conductive layer having a first portion on a first sidewall of the tunnel junction barrier and a second portion that extends transverse to the first portion onto a first one of the second channels of the second planar transistor, and a second continuous conductive layer having a first portion on a second sidewall of the tunnel junction barrier opposite the first sidewall and a second portion that extends transverse to the first portion onto a second one of the second channels of the second planar transistor.

17. A memory device according to claim 15, wherein the gate electrodes of the tunnel junction barrier transistor and the second planar transistor comprise a continuous conductive layer disposed on first and second opposing sidewalls of the tunnel junction barrier and on respective portions of the substrate adjacent the first and second sidewalls.

18. A memory device according to claim 15, further comprising respective first and second impurity doped regions in the substrate on respective sides of the tunnel junction barrier transistor and electrically coupled to respective ones of the second channels.

19. A memory device comprising:

a multi-layered structure of a storage node, a tunnel junction barrier, and a data electrode sequentially stacked on a semiconductor substrate;

a gate electrode on a sidewall of the multi-layered structure and on the semiconductor substrate outside of the multi-layered structure; and an impurity-doped region in the semiconductor substrate outside of the gate electrode.

20. A memory device according to claim 19, wherein the semiconductor substrate below the storage node serve as a first channel, and the semiconductor substrate below the gate electrode serves as a second channel, wherein the second channel serves as a source/drain for the first channel and couples the first channel to the impurity-doped region.

* * * * *

UNITED STATES PATENT AND TRADEMARK OFFICE
CERTIFICATE OF CORRECTION

PATENT NO. : 7,042,107 B2  Page 1 of 1
APPLICATION NO. : 10/800792
DATED : May 9, 2006
INVENTOR(S) : Baik It is certified that error appears in the above-identified patent and that said Letters Patent is hereby corrected as shown below:

Column 14, Claim 1, Line 2: Please correct "junction baffler"
To read -- junction barrier --

Signed and Sealed this

Eighteenth Day of March, 2008

JON W. DUDAS
*Director of the United States Patent and Trademark Office*